United States Patent
Wanat et al.

(10) Patent No.: US 6,924,016 B2
(45) Date of Patent: Aug. 2, 2005

(54) ASSEMBLY SYSTEM FOR STATIONING SEMICONDUCTOR WAFER SUITABLE FOR PROCESSING AND PROCESS FOR MANUFACTURING SEMICONDUCTOR WAFER

(75) Inventors: Stanely F. Wanat, Scotch Plains, NJ (US); Robert R. Plass, Hackensack, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/395,747

(22) Filed: Mar. 24, 2003

(65) Prior Publication Data

US 2003/0190446 A1 Oct. 9, 2003

Related U.S. Application Data

(63) Continuation-in-part of application No. 09/975,437, filed on Oct. 11, 2001, now abandoned.

(51) Int. Cl.$^7$ .......................... B32B 33/00; B32B 9/00; H01L 21/44; H01L 21/48
(52) U.S. Cl. .................... 428/40.1; 438/118; 438/464; 524/503
(58) Field of Search .................. 438/464, 33, 118; 523/122; 524/503, 524, 366, 522; 428/40.1

(56) References Cited

U.S. PATENT DOCUMENTS

| | | | |
|---|---|---|---|
| 3,905,928 A | 9/1975 | Sidi et al. ................... 523/122 |
| 4,073,756 A | 2/1978 | Yotsuyanagi et al. .... 106/200.3 |
| 4,247,590 A | * 1/1981 | Hayakawa et al. ......... 428/210 |
| 4,251,400 A | * 2/1981 | Columbus .................... 524/24 |
| 4,853,286 A | * 8/1989 | Narimatsu et al. .......... 428/343 |
| 5,151,457 A | * 9/1992 | Ishida et al. ................ 524/157 |
| 5,196,443 A | * 3/1993 | Oppong et al. ............. 514/367 |
| 5,229,447 A | 7/1993 | Miyajima et al. ........... 524/377 |
| 5,534,053 A | 7/1996 | Payne et al. ................ 106/236 |
| 5,637,395 A | 6/1997 | Uemura et al. ............. 428/343 |
| 5,679,732 A | * 10/1997 | Van Rheenen ................ 524/21 |
| 5,851,664 A | 12/1998 | Bennett et al. ........ 428/355 BL |
| 5,861,456 A | 1/1999 | Berten et al. ................ 524/556 |
| 5,942,445 A | 8/1999 | Kato et al. .................. 438/691 |
| 6,171,385 B1 | * 1/2001 | Rurlaender et al. ......... 106/659 |
| 6,277,481 B1 | * 8/2001 | Sugino et al. ........... 428/317.1 |
| 6,297,076 B1 | * 10/2001 | Amagai et al. ............. 438/114 |
| 6,488,803 B2 | * 12/2002 | Kiuchi et al. ............... 156/230 |
| 2002/0134986 A1 | * 9/2002 | Kamemura et al. ........... 257/98 |

FOREIGN PATENT DOCUMENTS

| | | |
|---|---|---|
| EP | 0 530 729 A | 3/1993 |
| EP | 530 729 | 3/1993 |
| JP | 09-157628 | * 6/1997 |
| JP | 09-260471 | * 10/1997 |
| JP | 015573 A | 1/2000 |

OTHER PUBLICATIONS

Disco Fully Automatic In Feed Surface Grinder, 2001.*
Ernest W. Flick, Handbook of Adhesive Raw Materials, 1989.*
DuPont Zonyl and Forafac Fluoroadditives, reprinted Jul. 29, 2004 at http://www.dupont.com/zonyl/flash.htm.*

\* cited by examiner

*Primary Examiner*—Harold Pyon
*Assistant Examiner*—Patricia L. Nordmeyer
(74) *Attorney, Agent, or Firm*—Alan P. Kass

(57) ABSTRACT

Disclosed is an assembly system for stationing a semiconductor wafer suitable for processing said wafer, said system comprising: (a) a holding block; (b) a semiconductor wafer; and (c) an aqueous adhesive composition interposed between the holding block and the semiconductor wafer. Also disclosed is a process for manufacturing a semiconductor wafer, comprising the steps of: (a) providing a holding block; (b) providing a semiconductor wafer; (c) coating either the holding block or one side of the semiconductor wafer with the foregoing aqueous adhesive composition; (d) contacting either one side of the semiconductor wafer to the coated holding block or the coated side of the semiconductor wafer to the holding block, such that the semiconductor wafer adheres to the coated holding block; (e) polishing the other side of the semiconductor wafer; and (f) removing the semiconductor wafer from the coated holding block.

37 Claims, No Drawings

ASSEMBLY SYSTEM FOR STATIONING SEMICONDUCTOR WAFER SUITABLE FOR PROCESSING AND PROCESS FOR MANUFACTURING SEMICONDUCTOR WAFER

CROSS-REFERENCE TO RELATED APPLICATION

This application is a continuation-in-part of U.S. patent application Ser. No. 09/975,437, filed Oct. 11, 2001 now abandoned.

FIELD OF THE INVENTION

The present invention provides an assembly system for stationing a semiconductor wafer suitable for the processing of said wafer and also provides a process for manufacturing a semiconductor wafer.

BACKGROUND OF THE INVENTION

The ubiquitous integrated chips utilized in the making of modern electronic devices are constructed from small, fragile silicon wafers. It is imperative that these wafers possess flat, blemish-free, mirror-like surfaces, since surface imperfections can adversely affect the electrical properties of the final integrated chips.

Typically, substrate wafers are cut by diamond-sawing single crystal silicon rods. In order to ensure integrated chips of sound structural integrity, it is first necessary to remove the roughened portion of the crystal surface which was produced during the sawing procedure prior to having circuit elements and conductor wirings formed thereon which then forms a semiconductor chip suitable for use in today's electronic items.

The first operation for obtaining a blemish-free surface is called "lapping". The lapping operation employs a coarse abrasive such as coarse alumina or silicon carbide abrasive particles. Lapping removes coarse surface imperfections from the sawing operation. Lapping also provides flatness and parallelism to the surface.

After the lapping operation, a series of polishing steps are employed to eliminate the remaining surface imperfections. During the polishing operation, a number of silicon wafers are typically mounted or "fixtured" onto a nonceramic (such as metal) or ceramic carrier or polishing head by a template assembly or by an adhesive material, in order to eliminate the need for manually polishing each individual wafer. The template assembly consists of impregnated polyurethane and plastic retaining rings to hold the silicon wafers in place. Adhesive materials may be a wax or a resin dissolved in a suitable solvent.

However, it is desirable to utilize water-based adhesive materials to avoid the problems associated with volatile organic solvents. Furthermore, since the adhesive materials used are derived from natural products (such as rosin), there are inconsistencies associated with batch to batch variations which makes it difficult for one to maintain a tight control on product variation. The batch to batch variation can in turn lead to adhesion problems of the semiconductor wafer to the nonceramic or ceramic carrier or polishing head, leading to wafer defects. Therefore, in order to avoid problems stemming from batch to batch variations, it is also desirable to use adhesive compositions comprising synthetic components or products. The present invention avoids the aforementioned problems in that it provides water-based adhesive compositions and utilizes synthetic components.

U.S. Pat. No. 5,942,445 discloses a method of manufacturing a semiconductor wafer comprising the steps of flattening a thin disc-shaped wafer obtained right after slicing by surface grinding, and polishing the flattened wafer on both sides simultaneously. This patent discloses the presence of a wax or like adhesive between wafer and a base plate.

U.S. Pat. No. 5,534,053 discloses a method for reducing or eliminating static charges on fixturing adhesive films and silicon wafers so treated by adding an antistatic agent to the fixturing adhesive.

SUMMARY OF THE INVENTION

The present invention provides an assembly system for stationing a semiconductor wafer suitable for processing the wafer, said system comprising:
(a) a holding block;
(b) a semiconductor wafer; and
(c) an aqueous adhesive composition interposed between the holding block and the semiconductor wafer, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth) acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

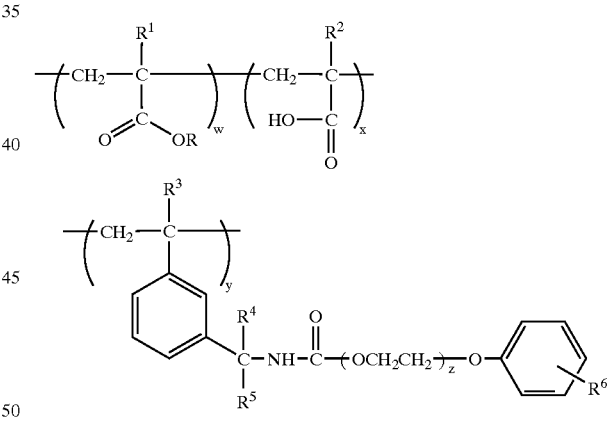

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100.

The present invention also provides for processing a semiconductor wafer, comprising the steps of:
(a) providing a holding block;
(b) providing a semiconductor wafer;
(c) coating one side of the holding block with an aqueous adhesive composition, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

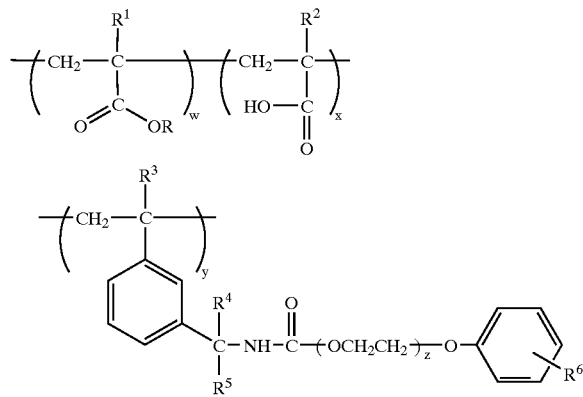

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;

(d) contacting one side of the semiconductor wafer to the coated side of the holding block, such that the semiconductor wafer adheres to the coated holding block;

(e) polishing the other side of the semiconductor wafer; and (f) removing the semiconductor wafer from the coated holding block.

The present invention also provides for processing a semiconductor wafer, comprising the steps of:

(a) providing a holding block;

(b) providing a semiconductor wafer;

(c) coating one side of the semiconductor wafer with an aqueous adhesive composition, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth) acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

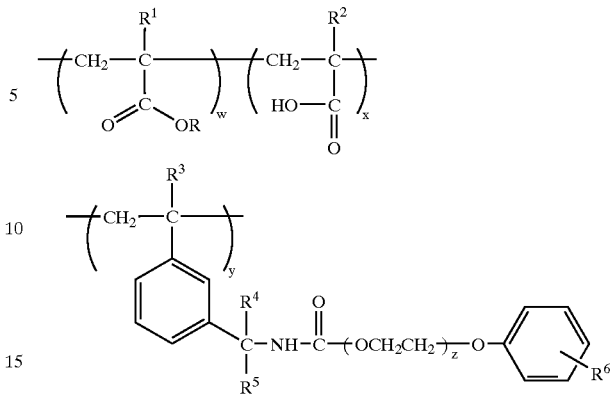

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;

(d) contacting the coated side of the semiconductor wafer to the holding block such that the semiconductor wafer adheres to the coated holding block;

(e) polishing the other uncoated side of the semiconductor wafer; and (f) removing the semiconductor wafer from the coated holding block.

For the aqueous adhesive, the release agent can be present at a level of about 0.05% to about 20% by weight of the adhesive composition, the resin can be present at a level of about 5% to about 50% by weight of the adhesive composition, and water can be present at a level of about 5% to about 95% by weight of the adhesive composition. In certain preferred embodiments, the release agent is a nonionic fluorosurfactant or a polyethylene glycol.

Additionally, in certain preferred embodiments, the water-soluble or water dispersible resin can be an unsubstituted or substituted (meth)acrylic acid containing polymer which can further be a styrene-acrylic acid copolymer or the resin can be an unsubstituted or substituted vinyl ester containing polymer which can further be a vinyl alcohol-vinyl acetate copolymer. In certain preferred embodiments, the vinyl alcohol-vinyl acetate copolymer has a weight average molecular weight ($M_w$) of about 5,000 to about 250,000. In other certain preferred embodiments, the styrene-acrylic acid copolymer having a weight average molecular weight (Mw) of about 500 to about 50,000.

The aqueous adhesive composition can additionally comprise at least one of the following components: an alcohol having about 2 to 5 carbon atoms, an aqueous ammonium hydroxide solution, and a biocide composition.

In still further preferred embodiments, for the aqueous adhesive composition, the release agent is polyethylene glycol and the water-soluble or water dispersible resin is selected from unsubstituted or substituted (meth)acrylic acid containing polymer or unsubstituted or substituted (meth) acrylate containing polymer, the resin more preferably being a styrene-acrylic acid copolymer. Preferably, the resin is made water-soluble or water-dispersible by partially neutralizing the styrene-acrylic acid copolymer with ammonium hydroxide.

In still further preferred embodiments, for the aqueous adhesive composition, the release agent is polyethylene glycol and the resin is an unsubstituted or substituted vinyl ester containing polymer, the resin more preferably being a vinyl alcohol-vinyl acetate copolymer.

In still further preferred embodiments, the aqueous adhesive composition comprises, by weight, about 5% to about 95% water, about 0.05% to about 20% of polyethylene glycol having a weight average molecular weight (Mw) of about 100 to 10,000, and about 5% to about 50% of styrene-acrylic acid copolymer having a weight average molecular weight (Mw) of about 500 to about 50,000.

In still further preferred embodiments, the aqueous adhesive composition comprises, by weight, about 5% to about 95% water, about 0.05% to about 20% of polyethylene glycol having a weight average molecular weight (Mw) of about 100 to 10,000, about 5% to about 40% of vinyl alcohol-vinyl acetate copolymer having a weight average molecular weight (Mw) of about 5,000 to 50,000, and 0.05% to 1% of a biocide composition comprising 4,4-dimethyloxazolidine, 3,4,4-trimethyloxazolidine, and mixtures thereof.

In certain embodiments related to the processing of the semiconductor wafer, prior to step (d), the coated holding block or the coated semiconductor wafer is heated at a temperature of from about 40° C. to about 120° C., more preferably from about 70° C. to about 100° C., even more preferably from about 80° C. to about 100° C., and even further preferably from about 90° C. to about 100° C. In certain other embodiments related to the processing of the semiconductor wafer, step (d) takes place at a temperature of from about 40° C. to about 120° C., more preferably from about 70° C. to about 100° C., even more preferably from about 80° C. to about 95° C., and even further preferably from about 90° C. to about 100° C. as well as at a pressure of from about 0.1 to about 0.2 kg/cm$^2$.

In preferred embodiments, the Tg (or glass transition) of the dried adhesive ranges from about 20° C. to about 100° C., more preferably from about 25° C. to about 40° C.

DESCRIPTION OF THE PREFERRED EMBODIMENTS

The present invention provides an assembly system for stationing a semiconductor wafer suitable for processing the wafer, said system comprising:

(a) a holding block;

(b) a semiconductor wafer; and (c) an aqueous adhesive composition interposed between the holding block and the semiconductor wafer, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth) acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

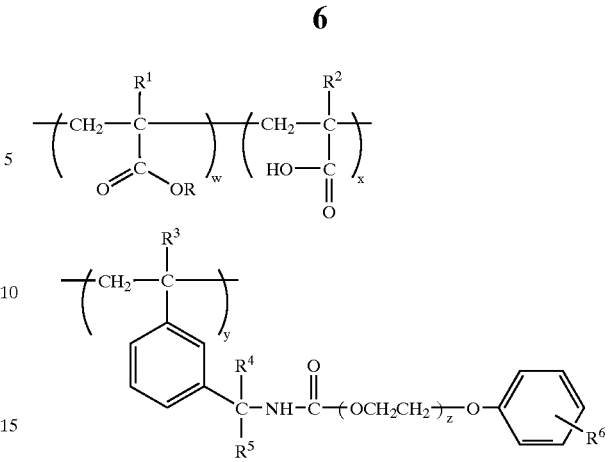

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100.

The present invention also provides for processing a semiconductor wafer, comprising the steps of:

(a) providing a holding block;

(b) providing a semiconductor wafer;

(c) coating one side of the holding block with an aqueous adhesive composition, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

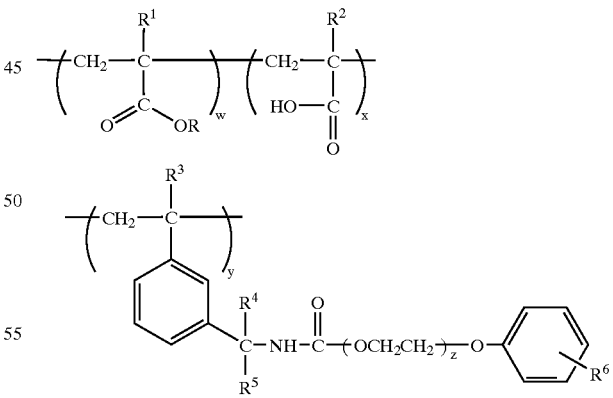

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;

(d) contacting one side of the semiconductor wafer to the coated side of the holding block, such that the semiconductor wafer adheres to the coated holding block;

(e) polishing the other side of the semiconductor wafer; and (f) removing the semiconductor wafer from the coated holding block.

The present invention also provides for processing a semiconductor wafer, comprising the steps of:

(a) providing a holding block;

(b) providing a semiconductor wafer;

(c) coating one side of the semiconductor wafer with an aqueous adhesive composition, the aqueous adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

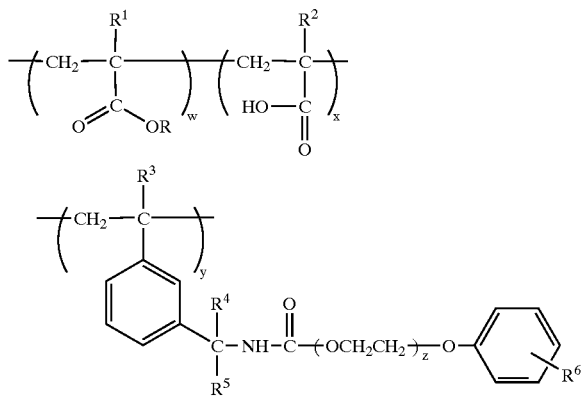

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;

(d) contacting the coated side of the semiconductor wafer to the holding block such that the semiconductor wafer adheres to the coated holding block;

(e) polishing the other uncoated side of the semiconductor wafer; and (f) removing the semiconductor wafer from the coated holding block.

For the aqueous adhesive, the release agent can be present at a level of about 0.05% to about 20% by weight of the adhesive composition, the resin can be present at a level of about 5% to about 50% by weight of the adhesive composition, and water can be present at a level of about 5% to about 95% by weight of the adhesive composition. In certain preferred embodiments, the release agent is a nonionic fluorosurfactant or a polyethylene glycol.

Additionally, in certain preferred embodiments, the water-soluble or water dispersible resin can be an unsubstituted or substituted (meth)acrylic acid containing polymer which can further be a styrene-acrylic acid copolymer or the resin can be an unsubstituted or substituted vinyl ester containing polymer which can further be a vinyl alcohol-vinyl acetate copolymer. In certain preferred embodiments, the vinyl alcohol-vinyl acetate copolymer has a weight average molecular weight ($M_w$) of about 5,000 to about 250,000. In other certain preferred embodiments, the styrene-acrylic acid copolymer having a weight average molecular weight (Mw) of about 500 to about 50,000.

The aqueous adhesive composition can additionally comprise at least one of the following components: an alcohol having about 2 to 5 carbon atoms, an aqueous ammonium hydroxide solution, and a biocide composition.

In still further preferred embodiments, for the aqueous adhesive composition, the release agent is polyethylene glycol and the water-soluble or water dispersible resin is selected from unsubstituted or substituted partially neutralized (meth)acrylic acid containing polymer or unsubstituted or substituted (meth)acrylate containing polymer, the resin more preferably being a styrene-acrylic acid copolymer. Preferably, the resin is made water-soluble or water-dispersible by partially neutralizing the styrene-acrylic acid copolymer with ammonium hydroxide.

In still further preferred embodiments, for the aqueous adhesive composition, the release agent is polyethylene glycol and the resin is an unsubstituted or substituted vinyl ester containing polymer, the resin more preferably being a vinyl alcohol-vinyl acetate copolymer.

In still further preferred embodiments, the aqueous adhesive composition comprises, by weight, about 5% to about 95% water, about 0.05% to about 20% of polyethylene glycol having a weight average molecular weight (Mw) of about 100 to 10,000, and about 5% to about 50% of styrene-acrylic acid copolymer having a weight average molecular weight (Mw) of about 500 to about 50,000.

In still further preferred embodiments, the aqueous adhesive composition comprises, by weight, about 5% to about 95% water, about 0.05% to about 20% of polyethylene glycol having a weight average molecular weight (Mw) of about 100 to 10,000, about 5% to about 40% of vinyl alcohol-vinyl acetate copolymer having a weight average molecular weight (Mw) of about 5,000 to 50,000, and 0.05% to 1% of a biocide composition comprising 4,4-dimethyloxazolidine, 3,4,4-trimethyloxazolidine, and mixtures thereof.

In certain embodiments related to the processing of the semiconductor wafer, prior to step (d), the coated holding block or the coated semiconductor wafer is heated at a temperature of from about 40° C. to about 120° C., more preferably from about 70° C. to about 100° C., even more preferably from about 80° C. to about 100° C., and even further preferably from about 90° C. to about 100° C. In certain other embodiments related to the processing of the semiconductor wafer, step (d) takes place at a temperature of from about 40° C. to about 120° C., more preferably from about 70° C. to about 100° C., even more preferably from about 80° C. to about 95° C., and even further preferably from about 90° C. to about 100° C. as well as at a pressure of from about 0.1 to about 0.2 kg/cm².

In preferred embodiments, the Tg (or glass transition) of the dried adhesive ranges from about 20° C. to about 100° C., more preferably from about 25° C. to about 40° C.

Holding Block

The holding block of the present assembly system should preferably be flat, should not warp under temperature change of 0° C. and 100° C. and should be amenable to rapid heating. In one embodiment, the holding block is made of a ceramic material, such as silicon carbide, zinc oxide, aluminum oxide, or titanium dioxide material.

Suitable examples of nonceramic materials that can be used for the holding block include metal and various polymer derived materials such as high temperature thermoset resins, Bakelite, high temperature polyimides, and highly crosslinked polyurethanes.

The Adhesive Composition

The adhesive composition of the present invention comprises: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

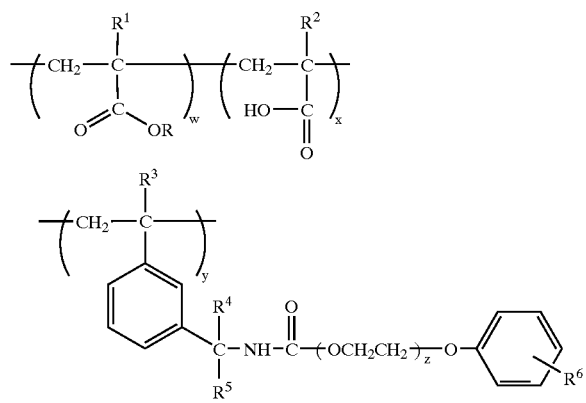

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100.

As used herein, "(meth)acrylic" or "(meth)acrylate" denotes, respectively, either methacrylic or acrylic, or methacrylate or acrylate.

The resin in the adhesive composition is water-soluble or water-dispersible. Those skilled in the art will recognize that for some resins, they must be partially neutralized (for example, unsubstituted or substituted (meth)acrylic acid containing polymers) so that the resins are soluble or dispersible in water. The amount of neutralization will differ, depending upon how much methacrylic or acrylic functionality is present in the resin. For other resins, those skilled in the art will recognize that certain monomers may be required to assist in making the resin water-soluble or water-dispersible. Still for other resins, those skilled in the art will recognize that certain pendent groups may have to be hydrolyzed (for example, polyvinyl acetate) to make the resin water-soluble or water-dispersible. Those skilled in the art will recognize and appreciate the various methods available to make resins water-soluble or water-dispersible, depending upon the resin that is to be used.

In certain embodiments, when an unsubstituted or substituted (meth)acrylic acid containing polymer is desired to be used, a portion of the (meth)acrylic acid in the resin is desirably partially neutralized, with for example ammonium hydroxide, to render the resin water-soluble or water-dispersible.

As used herein, the term "hydrocarbyl substituent" or "hydrocarbyl group" is used in its ordinary sense, which is well known to those skilled in the art. Specifically, it refers to a group having a carbon atom directly attached to the remainder of the molecule and having predominantly hydrocarbon character. Examples of hydrocarbyl groups include:

(1) hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical);

(2) substituted hydrocarbon substituents, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(3) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

As used herein, "release agent" denotes an additive that facilitates removal of the wafer with a minimum of adhesive transfer to the wafer.

In one embodiment, the release agent in the present aqueous adhesive composition is present at a level of from 0.05% to 20%, and in one embodiment, from 0.1 to 15%, and in one embodiment, from 0.5% to 10% by weight of the adhesive composition.

In one embodiment, the water present in the present aqueous adhesive composition is present at a level of 5% to 95%, and in one embodiment, from 30% to 90%, and in one embodiment, from 60% to 80% by weight of the adhesive composition.

In one embodiment, the resin is present at a level of 5 to 50%, and in one embodiment 10% to 30%, and in one embodiment at 15% to 25% by weight of the adhesive composition.

The polyethylene glycol of the present invention preferably has a weight average molecular weight ($M_w$) ranging from 100 to 50,000, in one embodiment from 100 to 10,000, in one embodiment from 5,000 to 30,000, and in one embodiment from 100 to 500. They are available commercially, for example under the name "CRISANOL™" polyethylene glycol from Clariant Corporation. In one embodiment, the polyethylene glycol is present at a level of 1–15%, and in one embodiment 4–10% by weight of the adhesive composition.

The fluorine-free surfactant selected from anionic, cationic, and nonionic surfactants is not particularly limited, although the fluorine-free nonionic surfactant is preferred. Examples of the preferred fluorine-free nonionic surfactants include, but are not limited to, alkyl ethoxylated surfactants as well others which are well known to those skilled in the art.

One type of nonionic surfactant is alkyl alkoxylated surfactant, such as addition products of ethylene oxide, or propylene oxide, with fatty alcohols, fatty acids, fatty amines, etc. Optionally, addition products of mixtures of ethylene oxide and propylene oxide with fatty alcohols, fatty acids, fatty amines can be used. The alkoxylated surfactant includes compounds having the general formula:

$$R^8\text{-}Z\text{-}(A)_s B$$

wherein $R^8$ is an alkyl group or an alkyl aryl group, selected from the group consisting of primary, secondary and branched chain alkyl groups, primary, secondary and branched chain alkenyl groups, and/or primary, secondary and branched chain alkyl- and alkenyl-substituted phenolic groups having from about 6 to about 20 carbon atoms, preferably from about 8 to about 18, more preferably from about 10 to about 15 carbon atoms; s is an integer from about 2 to about 50, preferably from about 2 to about 20, more preferably from about 2 to about 15; A is EO (ethylene oxide), PO (propylene oxide) or mixtures thereof; B is hydrogen, a carboxylate group, or a sulfate group; and linking group Z is selected from the group consisting of: —O—, —N(R)$_x$—, —C(O)O—, —C(O)N(R)—, —C(O)N(R)—, and mixtures thereof, in which R, when present, is $R^8$, a lower alkyl with about 1 to about 4 carbons, a polyalkylene oxide, or hydrogen, and x is 1 or 2.

Further specific examples of these nonionic surfactants include, inter alia, condensation products of alkylene oxide groups with an organic hydrophobic compound, such as an aliphatic compound or with an alkyl aromatic compound. The nonionic surfactants generally are the condensation products of an organic aliphatic or alkyl aromatic hydrophobic compound and hydrophilic ethylene oxide groups. Practically any hydrophobic compound having a carboxy, hydroxy, amido, or amino group with a free hydrogen attached to the nitrogen can be condensed with ethylene (propylene) oxide or with the polyhydration product thereof, polyethylene (or polypropylene) glycol, to form a water soluble nonionic surfactant.

One example of such a nonionic surfactant is the condensation product of one mole of an alkyl phenol having an alkyl group containing from 6 to 12 carbon atoms with from about 5 to 25 moles of an alkylene oxide. Another example of such a nonionic surfactant is the condensation product of one mole of an aliphatic alcohol which may be a primary, secondary or tertiary alcohol having from 6 to 18 carbon atoms with from 1 to about 10 moles of alkylene oxide. Preferred alkylene oxides are ethylene oxides or propylene oxides which may be present singly, or may be both present.

Other examples of nonionic surfactants include primary and secondary linear and branched alcohol ethoxylates, such as those based on $C_6$–$C_{18}$ alcohols which further include an average of from 2 to 80 moles of ethoxylation per mol of alcohol. Examples of these nonionic surfactants are available under Neodol® (which, for example, include higher aliphatic, primary alcohol containing about 9–15 carbon atoms, such as $C_{9-11}$ alkanol condensed with 4 to 10 moles of ethylene oxide (Neodol 91-8 or Neodol 91-5), $C_{12-13}$ alkanol condensed with 6.5 moles ethylene oxide (Neodol 23-6.5), $C_{12-15}$ alkanol condensed with 12 moles ethylene oxide (Neodol 25-12), $C_{14-15}$ alkanol condensed with 13 moles ethylene oxide (Neodol 45-13), and the like) (Shell Chemical Company, Houston, Tex.) or Genapol® series (which, for example, include $C_{12-16}$ linear alcohols condensed with 1 mole of ethylene oxide (Genapol 24-L-3); $C_{12-16}$ linear alcohols condensed with 1.6 moles of ethylene oxide (Genapol 26-L-1.6); $C_{12-16}$ linear alcohols condensed with 2 moles of ethylene oxide (Genapol 26-L-2); $C_{12-16}$ linear alcohols condensed with 3 moles of ethylene oxide (Genapol 26-L-3); $C_{12-16}$ linear alcohols condensed with 3 moles of ethylene oxide (Genapol 26-L-5); as well as $C_{12-16}$ linear alcohols condensed with varying amounts of ethylene oxide to provide specific cloud points of the surfactant (i.e., Genapol 26-L-60, Genapol 26-L-60N, and Genapol 26-L-98N) (Clariant Corporations, Charlotte, N.C.).

Other examples include secondary $C_{12}$–$C_{15}$ alcohol ethoxylates, including those which have from about 3 to about 10 moles of ethoxylation. Such are available, for example, in the Tergitol® series of nonionic surfactants (for example, $C_{11-15}$ secondary alkanol condensed with either 9 EO (Tergitol 15-S-9) or 12 EO (Tergitol 15-S-12) (Dow Chemical, Midland, Mich.).

Some other typical alkoxylated alcohols include ICONOL™ ethoxylated decyl alcohols (oxide content is 4–6 moles of EO), ICONOL™ ethoxylated tridecyl alcohols (oxide content is 3–10 moles of EO), the Macol® lauryl alcohol ethoxylates (oxide content is 4–23 moles of EO), Plurafac® A series stearyl alcohol ethoxylates (oxide content is 25–50 moles of EO) (BASF Corporation), DETROL™ OC alkyl ethoxylates (Dexter Chemical L.L.C.), and TRITON™ alcohol alkoxylate (Rohm & Haas).

Those skilled in the art will know and understand the types of anionic and cationic surfactants that are available, including those described in McCutcheon's Detergents and Emulsifiers, North American Edition, 2002; and Kirk-Othmer, Encyclopedia of Chemical Technology, 4th Ed., Vol. 23, pp. 478–541, the contents of which are herein incorporated by reference.

The fluorine-containing surfactants include anionic, cationic, and nonionic fluorosurfactants with nonionic fluorosurfactants being preferred. Suitable nonlimiting examples include those fluorosurfactants available from Dupont under the name "ZONYL®", those available from Dainippon Ink & Chemicals, Inc., under the name "MEGAFACE™", and those available from 3M under the name "FLUORAD™". The silicone polymers include without limitation polyether modified silicones and polydimethylsiloxane (PDMS) materials, including silicone-urethane copolymers. While not wishing to be bound by theory, it is believed that the silicone polymers migrate to the surface and act as release coats due to their low surface tension. Both "reactive" modified and "nonreactive" modified PDMS polymers can be used.

While not wishing to be bound by theory, it is believed that "reactive" modified PDMS materials can be chemically bonded to the adhesive matrix to provide less different adhesive properties in the bulk and at both the upper and lower bonding interfaces. "Nonreactive" modified PDMS materials include alkoxylate-modified PDMS that have limited water solubility for use in aqueous systems.

While not wishing to be bound by theory, it is believed that silicone-urethane copolymers (polyurethane copolymers made with dimethylsiloxane segments) give the properties of a film forming urethane with their high temperature stability combined with ultra high release properties of silicones without phase separation. Such copolymers are commercially available from Dinichiseika Color and Chemicals MFG Co. Ltd. (DNS), and from Polyurethane Specialties Co. Inc. Polyether modified silicones are available from Advanced Polymer, Inc.

The unsubstituted or substituted (meth)acrylic acid containing polymers or the unsubstituted or substituted (meth)acrylate containing polymers can be any polymer containing unsubstituted or substituted acrylic acid, unsubstituted or substituted methacrylic acid, unsubstituted or substituted acrylate or unsubstituted or substituted methacrylate as at least one of the repeating units. In one embodiment, the unsubstituted or substituted (meth)acrylic acid containing polymer or unsubstituted or substituted (meth)acrylate containing polymer is a styrene-acrylic acid copolymer. This copolymer preferably has a weight average molecular weight ($M_w$) ranging from 500 to 300,000 and in one embodiment from 500 to 2500, and in one embodiment from 500 to 50,000. They may be available commercially, for example, under the name "JONCRYL®" from S. C. Johnson Polymer. These JONCRYL® materials are usually aqueous solutions containing water, ammonium hydroxide and styrene-acrylic acid copolymers. In one embodiment, the styrene acrylic acid copolymer is present in the adhesive composition at a level of about 5 to 50% by weight of the adhesive composition.

The unsubstituted or substituted vinyl ester containing polymer can be any polymer containing an unsubstituted or substituted vinyl ester as at least one of the repeating units. Examples of vinyl esters include vinyl acetate, vinyl propionate vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate with vinyl acetate being preferred in one embodiment as the only repeating unit, that is, polyvinyl acetate. In one embodiment, it is available as an aqueous emulsion from National Starch Chemical Corporation. In another embodiment, the vinyl acetate is a dextrin-modified polyvinyl acetate. In yet another embodiment, vinyl acetate polymer comprises a vinyl alcohol-vinyl acetate copolymer. These copolymers can be made by partial hydrolysis of starting polyvinyl acetate with methanol, in the presence of a suitable catalyst such as sodium hydroxide. The vinyl alcohol-vinyl acetate copolymer preferably has a weight average molecular weight ($M_w$) ranging from 5,000 to 250,000 and in one embodiment from 10,000 to 100,000 and in one embodiment from 5,000 to 50,000. These copolymers are available commercially, for example, under the name "MOWIOL®" available from Clariant Corporation. Some preferred Mowiol copolymers include Mowiol 3-83, Mowiol 8-88, Mowiol 5-72 and Mowiol 15-20. The first number in this nomenclature relates to molecular weight and viscosity, while the second number relates to the degree of hydrolysis. For example, Mowiol 3-83 is 83% hydrolyzed polyvinyl acetate, and has a $P_w$ (weight average degree of polymerization) of 350, while Mowiol 8-88 has $P_w$ of 1000 and is 88% hydrolyzed polyvinyl acetate.

The unsubstituted or substituted vinyl aromatic containing polymer can be any polymer containing an unsubstituted or substituted vinyl aromatic as at least one of the repeating units. Examples of vinyl aromatics include vinyl toluene, styrene, p-methyl styrene, p-tert butylstyrene, bromostyrene, chlorostyrene, fluorostyrene and the like.

The polymer represented by the formula

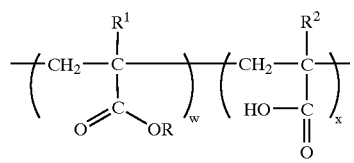

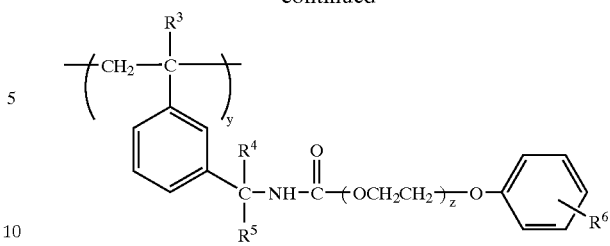

preferably is an adduct of an ethoxylated nonylphenol with poly(ethyl acrylate-co-methyacrylic acid-co-3-(1-isocyanato-1-methylethyl)-alpha-methylstyrene), said adduct being represented by the formula

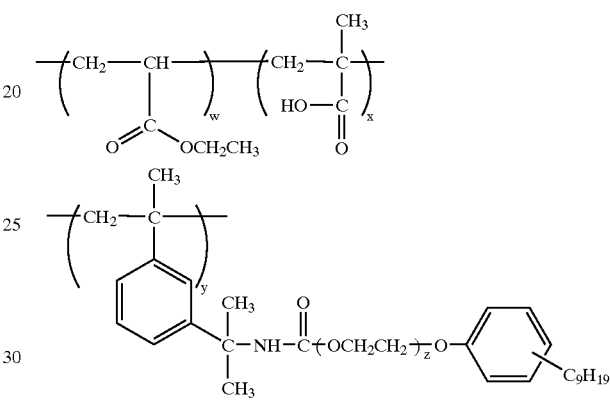

wherein w, x, y, and z represent respectively the number of repeating units of ethyl acrylate, acrylic acid, 3-(1-isocyanato-1-methylethyl)-alpha-methylstyrene/ethoxylated nonylphenol adduct, as shown, and ethylene oxide. The parameters w, x, and y can be varied by one skilled in the art to obtain appropriate molecular weights of these polymers and the appropriate ratios of the various repeat units. A 25 wt % solution in water of copolymer is available from Aldrich (product number 45,815-5; viscosity 10–100 cps; bp 73° C.).

The rosin-modified maleic resin of this invention has no limitations on the kind thereof, and its commercially available products include those available under the names "MALKYD™" and "HIPARAC™", such as Malkyd No. 31 and Malkyd No. 32 (by Arakawa Chemicals Co., Ltd.), Hiparac C and Hiparac PR (by Nippon Shellac Co., Ltd.), Harimac 145P and Harimac R-120AH (by Harima Chemical Industry Co., Ltd.), etc.

The novolak resin of the present invention is not limited in any way. Preferred novolak resins include those made from ortho- and para-cresol, and in one embodiment, in order to provide enhanced aqueous base solubilities, the novolak resins are preferentially polyhydroxy-based phenolic resins. Those skilled in the art will know the various monomers and reaction conditions needed to make novolak resins.

In some instances, the adhesive composition adheres more strongly to the holding block than to the semiconductor wafer. This means that the adhesive force between the holding block and the adhesive composition is stronger than that between the semiconductor wafer and the adhesive composition. This makes it easier to clean the semiconductor wafer since there will be little adhesive left on the wafer. However, in those instances where more adhesive is left on the wafer, this is not a difficult situation since the adhesive can be just as easily removed from the wafer as well.

The aqueous adhesive composition of the present invention can also contain one or more optional ingredients. Some preferred ingredients include alcohols having 2 to 5 carbon atoms, aqueous base solution, biocide compositions, water-soluble dyes and dispersions, and water dispersible or soluble pigments. Examples of suitable alcohols include ethanol, 1-propanol, 2-propanol (isopropanol), 1- and 2-butanols, and 1-, 2-, and 3-pentanols, with isopropanol being the most preferred. In one embodiment, the aqueous base solution is ammonium hydroxide as a 0.5% to 60wt % dilute solution. One example of a biocide composition includes a combination of compounds such as 4,4-dimethyloxazolidine and 3,4,4-trimethyloxalidine (available from Dow Chemical as Bioban CS-1135). Those skilled in the art will appreciate other biocides that would be suitable for use in the present invention. In one embodiment, the biocide composition is present at a level of 0.05% to 1% by weight of the aqueous adhesive composition.

The present invention also provides a process for polishing a semiconductor wafer, comprising the steps of:
(a) providing a holding block;
(b) providing a semiconductor wafer;
(c) coating either the holding block or one side of the semiconductor wafer with the foregoing aqueous adhesive composition;
(d) contacting either one side of the semiconductor wafer to the coated holding block or the coated side of the semiconductor wafer to the holding block, such that the semiconductor wafer adheres to the coated holding block;
(e) polishing the other uncoated side of said semiconductor wafer; and
(f) removing the semiconductor wafer from the coated ceramic holding block.

In certain embodiments related to the polishing of the semiconductor wafer, prior to step (d), the coated holding block or the coated semiconductor wafer is heated at a temperature of from about 40° C. to about 120° C., more preferably from about 70° C. to about 100° C., even more preferably from about 80° C. to about 100° C., and even further preferably from about 90° C. to about 100° C. In certain other embodiments related to the polishing of the semiconductor wafer, step (d) can take place at a temperature of from about 40° C. to about 120° C., more preferably from about 70° C. to about 100° C., even more preferably from about 80° C. to about 95° C., and even further preferably from about 90° C. to about 100° C. as well as at a pressure of from about 0.1 to about 0.2 kg/cm$^2$.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

The following adhesive compositions illustrate some typical formulations. All weights are in grams. Tables 1 and 2 exemplify formulations with vinyl alcohol-vinyl acetate copolymer resins.

TABLE 1

|  | Ex. 1 | Ex. 2 | Ex. 3 | Ex. 4 | Ex. 5 | Ex. 6 | Ex. 7 | Ex. 8 | Ex. 9 |
| --- | --- | --- | --- | --- | --- | --- | --- | --- | --- |
| Mowiol[1] 8–88 |  | 1.75 | 0.93 |  |  |  |  |  |  |
| Mowiol[1] 3–88 |  |  |  | 19.00 |  |  |  |  |  |
| Mowiol[1] 3–83 | 18.10 |  |  |  | 19.50 | 19.75 | 20.00 | 18.81 | 26.40 |
| PEG[2] 200 | 9.05 |  |  | 5.00 | 2.50 | 5.00 |  | 4.34 | 8.80 |
| PEG[2] 300 |  |  | 6.66 |  |  |  |  |  |  |
| PEG[2] 10 K |  | 2.30 | 6.60 |  |  |  |  |  |  |
| Water | 72.74 | 95.95 | 59.2 | 76.00 | 78.00 | 75.25 | 80.00 | 75.26 |  |
| 1% NH$_4$OH |  |  |  |  |  |  |  |  | 47.38 |
| Isopropanol |  |  | 26.66 |  |  |  |  |  | 3.31 |
| Bio-Ban-CS-1135[3] | 0.10 |  |  |  |  |  |  |  |  |

|  | Ex. 10 | Ex. 11 | Ex. 12 | Ex. 13 | Ex. 14 | Ex. 15 | Ex. 16 | Ex. 17 | Ex. 18 |
| --- | --- | --- | --- | --- | --- | --- | --- | --- | --- |
| Mowiol 5–72 |  |  |  |  |  |  |  | 14.89 |  |
| Mowiol 15–20 |  |  |  |  |  |  |  |  | 60.00 |
| Mowiol[1] 3–83 | 19.80 | 19.60 | 18.18 | 18.10 | 19.49 | 19.30 | 18.10 |  | 8.67 |
| PEG 200 | 1.00 | 2.00 | 9.09 | 9.00 | 1.99 | 1.97 | 9.05 | 7.72 |  |
| PEG 300 |  |  |  |  |  |  |  |  |  |
| PEG 10 K |  |  |  |  |  |  |  |  |  |
| Water | 79.20 | 78.40 | 72.73 | 72.40 | 77.97 | 77.21 | 72.75 | 77.72 | 31.33 |
| 1% NH$_4$OH |  |  |  |  |  |  |  |  |  |
| Isopropanol |  |  |  | 0.50 | 0.55 | 1.52 |  |  |  |
| Bio-Ban-CS-1135 |  |  |  |  |  |  | 0.10 |  |  |

TABLE 2

|  | Ex. 19 | Ex. 20 | Ex. 21 | Ex. 22 | Ex. 23 | Ex. 24 | Ex. 25 | Ex. 26 | Ex. 27 |
| --- | --- | --- | --- | --- | --- | --- | --- | --- | --- |
| Mowiol 3–83[1] | 99.90 | 99.75 | 80.00 | 99.75 | 99.50 | 80.00 | 99.90 | 99.75 | 80.00 |
| Megaface R-08[4] | 0.100 | 0.25 | 4.00 |  |  |  |  |  |  |
| F242T[5] |  |  |  | 0.25 | 0.50 | 4.00 |  |  |  |
| Tergitol NP-4[6] |  |  |  |  |  |  | 0.10 | 0.25 | 4.00 |
| Water |  |  | 16.00 |  |  | 16.00 |  |  | 16.00 |

Tables 3 and 4 exemplify formulations with styrene-acrylic acid copolymer resins.

TABLE 3

|  | Ex. 28 | Ex. 29 | Ex. 30 | Ex. 31 | Ex. 32 | Ex. 33 | Ex. 34 | Ex. 35 | Ex. 36 |
| --- | --- | --- | --- | --- | --- | --- | --- | --- | --- |
| Joncryl Eco 84[7] | 41.86 | 41.69 | 41.41 | 42 | 42 | 42 | 58.02 | 48.46 | 41.16 |
| PEG 200 | 6.98 | 6.95 | 6.91 | | | | | | |
| PEG-1000 | | | | 14 | 9.3 | 4.7 | | | |
| PEG-4000[2] | | | | | | | 6.60 | 8.59 | 4.71 |
| Fluorad FC-430[8] | | 0.40 | 1.06 | | | | | | |
| APS-437 (1%)[9] | | | | | | | | 2.44 | 2.52 |
| Water | 51.16 | 50.95 | 50.62 | 44 | 48.7 | 53.3 | 35.38 | 40.51 | 51.60 |

TABLE 4

|  | Ex. 37 | Ex. 38 | Ex. 39 | Ex. 40 | Ex. 41 | Ex. 42 | Ex. 43 | Ex. 44 | Ex. 45 |
| --- | --- | --- | --- | --- | --- | --- | --- | --- | --- |
| Joncryl Eco 84 | 49.98 | 49.94 | 44.44 | 49.98 | 49.94 | 44.44 | 49.98 | 49.94 | 44.44 |
| Megaface R-08 | 0.05 | 0.12 | 2.22 | | | | | | |
| F-242T | | | | 0.12 | 0.25 | 2.22 | | | |
| Tergitol NP-4 | | | | | | | 0.05 | 0.12 | 2.22 |
| Water | 49.98 | 49.94 | 53.33 | 49.94 | 49.88 | 53.33 | 49.98 | 49.94 | 53.33 |

Table 5 exemplifies formulations with adduct of ethoxylated nonylphenol with poly(ethyl acrylate-co-methyacrylic acid-co-3-(1-isocyanato-1-methylethyl)-alpha-methylstyrene).

TABLE 5

|  | Ex. 46 | Ex. 47 | Ex. 48 | Ex. 49 |
| --- | --- | --- | --- | --- |
| Poly Ac Co[10] | 3.80 | 2.20 | 6.25 | 48.90 |
| PEG 10 K[2] | 9.60 | 5.40 | 6.25 | |
| PEG 300[2] | | 43.50 | 12.50 | |
| Water | 48.10 | 27.30 | 25.00 | 16.38 |
| Isopropanol | 38.50 | 21.70 | 50.00 | 32.52 |
| Aquanol P-1[11] | | | | 2.45 |
| NH$_4$OH (aqueous) | | | | 0.22 |

[1]vinyl acetate-vinyl alcohol copolymer from Clariant Corporation.
[2]polyethylene glycols; molecular weight as indicated (200; 300; 4,000; 10,000).
[3]biocide composition (4,4-dimethyloxazolidine & 3,4,4-trimethyloxazolidine) from Dow Chemical Co..
[4]flurosurfactant; from Dai Nippon International Corporation.
[5]silicone polyethoxylate from Shin-Etsu.
[6]nonlyphenol polyethoxylate from Union Carbide; (alternatively, a linear alcohol ethoxylate could be used).
[7]aqueous solution of styrene-acrylic acid copolymer and ammonium hydroxide solution; from S.C. Johnson Polymer.
[8]fluorosurfactant; from 3M.
[9]polyether modified silicone surfactant from Advanced Polymer.
[10]adduct of ethoxylated nonylphenol with poly[ethyl acrylate-co-methylacrylic acid-co-3-(1-isocyanato-1-methylethyl)-alpha-methylstyrene]; Aldrich (Cat. No. 45,815-5).
[11]an aqueous vinyl alcohol-vinyl acetate copolymer.

The glass transition (Tg) of several formulations were measured using thermal mechanical analysis (TMA) (Perkin-Elmer). A sufficient amount of the formulations were coated onto silicone wafers and heated to drive off water to leave a 10 μm thick film. The wafers were broken and then tested by TMA. The results are as follows:

| Formulation | Tg (° C.) |
| --- | --- |
| Ex. 34 | 35 |
| Ex. 35 | 27 |
| Ex. 36 | 37 |

Application Example

Basic process for applying adhesive composition to holding block and ceramic wafer:

The adhesive composition is applied to the holding block by spin coating using spray, puddle coating or other dispensing methods. The coated holding block is dried by heating (from about 90° C. to about 100° C.) the block by hot plate, infrared heaters or forced hot air dryers. Unpolished wafers are adhered to the adhesive by pressing the warm coated block onto the wafer. Adhesion is assisted by applying pressure to the assembly or pulling vacuum on the system and then allowing the wafer/adhesive/holding block "sandwich" to cool.

The cooled wafer is polished by means of aqueous slurries containing polishing abrasives known to those skilled in the art. These may include, but are not limited to, quartz, pumice, silicon carbide etc. or mixtures thereof. The wafer is polished in a series of finer polishes until the desired surface polish is achieved.

The polished wafer/adhesive/holding block array is then rinsed with cold water and air dried with spinning. The polished wafer is finally removed by separating the wafer from the adhesive which essentially remains attached to the holding block. The separation can be accomplished by application of a blade or several blades to the interface between the wafer and the adhesive and exerting enough force to make a clean separation without deforming or breaking the wafer. Any adhesive that remains adhered to the unpolished side of the wafer can be removed/cleaned with a suitable cleaning solution (for example a mixture of water, ammonium hydroxide, and hydrogen peroxide; or warm or hot water).

Each of the documents referred to above is incorporated herein by reference. Except in the Examples, or where otherwise explicitly indicated, all numerical quantities in this description specifying amounts of materials, reaction conditions, molecular weights, number of carbon atoms, and the like, are to be understood as modified by the word "about."

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An assembly system for stationing a semiconductor wafer for processing comprising:
   (a) a holding block made of a ceramic material selected from the group consisting of silicon carbide, zinc oxide, aluminum oxide, and titanium dioxide;
   (b) a semiconductor wafer; and
   (c) an aqueous adhesive composition interposed between the holding block and the semiconductor wafer, the adhesive composition comprising: water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, novolak resins, and polymers represented by the formula

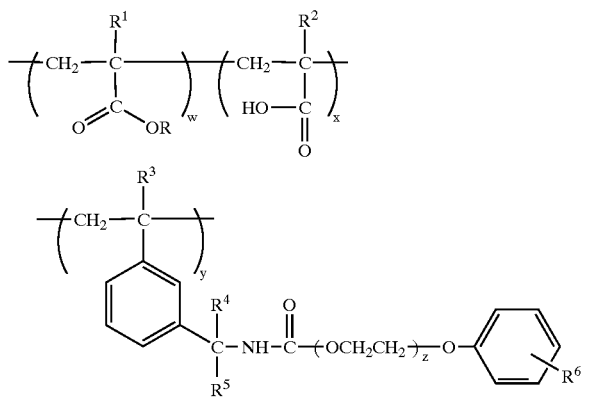

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100.

2. The assembly system of claim 1, wherein the release agent is present at a level of about 0.05% to about 20% by weight of the adhesive composition.

3. The assembly system of claim 1, wherein the resin is present at a level of about 5% to about 50% by weight of the adhesive composition.

4. The assembly system of claim 1, wherein water is present at a level of about 5% to about 95% by weight of the adhesive composition.

5. The assembly system of claim 1, wherein the release agent is a nonionic fluorosurfactant.

6. The assembly system of claim 1, wherein the unsubstituted or substituted (meth)acrylic acid containing polymer is a styrene-acrylic acid copolymer.

7. The assembly system of claim 1, wherein the unsubstituted or substituted vinyl ester containing polymer is a vinyl alcohol-vinyl acetate copolymer.

8. The assembly system of claim 7, wherein the vinyl alcohol-vinyl acetate copolymer has a weight average molecular weight ($M_w$) of about 5,000 to about 250,000.

9. The assembly system of claim 1, wherein the adhesive composition further comprises at least one of the following components: an alcohol having about 2 to 5 carbon atoms, an aqueous base solution, a biocide composition, a water soluble dye or dispersion, and a water dispersible or soluble pigment.

10. The assembly system of claim 9, wherein the alcohol is isopropanol.

11. The assembly system of claim 9, wherein the biocide composition comprises at least one compound selected from the group consisting of 4,4-dimethyloxazolidine, 3,4,4-trimethyloxazolidine, and mixtures thereof.

12. The assembly system of claim 1, wherein the release agent is polyethylene glycol and the resin is selected from unsubstituted or substituted (meth)acrylic acid containing polymer or unsubstituted or substituted (meth)acrylate containing polymer.

13. The assembly system of claim 12, wherein the resin is a styrene-acrylic acid copolymer.

14. The assembly system of claim 1, wherein the release agent is polyethylene glycol and the resin is an unsubstituted or substituted vinyl ester containing polymer.

15. The assembly system of claim 14, wherein the resin is a vinyl acetate-vinyl alcohol copolymer.

16. The assembly system of claim 1, wherein the adhesive composition comprises, by weight, about 5% to about 95% water, about 0.05% to about 20% of polyethylene glycol having a weight average molecular weight (Mw) of about 100 to 10,000, and about 5% to about 50% of styrene-acrylic acid copolymer having a weight average molecular weight (Mw) of about 500 to about 50,000.

17. The assembly system of claim 16, wherein the styrene-acrylic acid copolymer has a weight average molecular weight (Mw) of about 500 to about 2,500.

18. The assembly system of claim 1, wherein the adhesive composition comprises, by weight, about 5% to about 95% water, about 0.05% to about 20% of polyethylene glycol having a weight average molecular weight (Mw) of about 100 to 10,000, about 5% to about 40% of vinyl alcohol-vinyl acetate copolymer having a weight average molecular weight (Mw) of about 5,000 to 50,000, and 0.05% to 1% of a biocide composition selected from the group consisting of 4,4-dimethyloxazolidine, 3,4,4-trimethyloxazolidine and mixtures thereof.

19. The assembly system of claim 1 wherein the adhesive composition, when dried, has a glass transition temperature of from about 20° C. to about 100° C.

20. An assembly system for stationing a semiconductor wafer suitable for processing the wafer, the system comprising:
   (a) a holding block made of a ceramic material selected from the group consisting of silicon carbide, zinc oxide, aluminum oxide, and titanium dioxide;
   (b) a semiconductor wafer; and
   (c) an aqueous adhesive composition interposed between the holding block and the semiconductor wafer, the adhesive composition comprising: water in an amount of from about 5% to about 95% by weight of the adhesive composition; at least one release agent in an amount of from about 0.05% to about 20% by weight of the adhesive composition selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin in an amount of from about 5% to about 50% by weight of the adhesive composition selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, novolak resins, and polymers represented by the formula

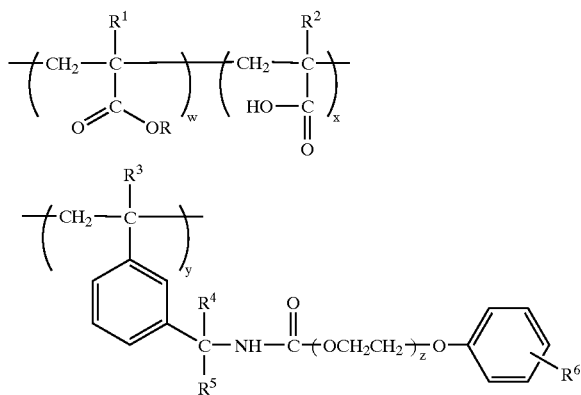

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100.

21. An assembly system for stationing a semiconductor wafer suitable for processing the wafer, the system comprising:
  (a) a holding block made of a ceramic material selected from the group consisting of silicon carbide, zinc oxide, aluminum oxide, and titanium dioxide;
  (b) a semiconductor wafer; and
  (c) an aqueous adhesive composition interposed between the holding block and the semiconductor wafer, the adhesive composition comprising water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, novolak resins, and polymers represented by the formula

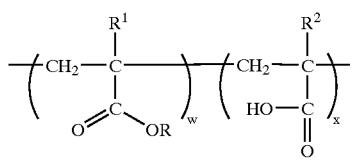

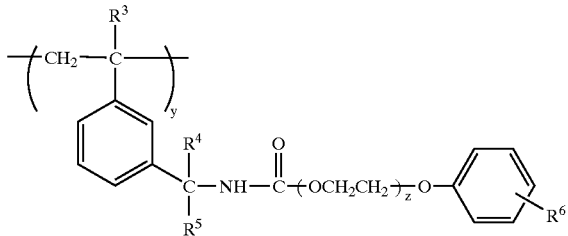

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^8$ is hydrocarbyl group of 1 to 20 carbon atoms; w, x, y, and z independently are a number from 1 to 100; and at least one of the following components: an alcohol having about 2 to 5 carbon atoms, an aqueous ammonium hydroxide solution, a biocide composition, a water soluble dye or dispersion, and a water dispersible or soluble pigment.

22. A process for manufacturing a semiconductor wafer, comprising the steps of:
  (a) providing a holding block;
  (b) providing a semiconductor wafer;
  (c) coating one side of the holding block with an aqueous adhesive composition, the aqueous adhesive composition comprising water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

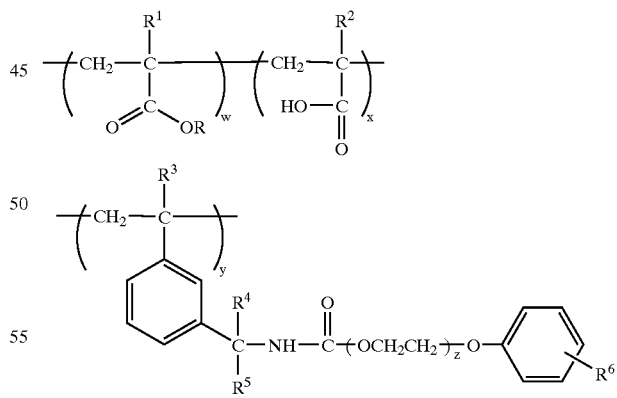

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;
  (d) contacting one side of the semiconductor wafer to the coated side of the holding block, such that the semiconductor wafer adheres to the coated holding block;

(e) polishing the other side of the semiconductor wafer; and (f) removing the semiconductor wafer from the coated holding block.

23. The process of claim 22 wherein prior to step (d), the coated holding block is heated to a temperature of from about 40° C. to about 120° C.

24. The process of claim 23 wherein the coated holding block is heated to a temperature of from about 70° C. to about 100° C.

25. The process of claim 24 wherein the coated holding block is heated to a temperature of from about 80° C. to about 100° C.

26. The process of claim 22 wherein step (d) takes place at a temperature of from about 40° C. to about 120° C.

27. The process of claim 26 wherein the temperature is from about 70° C. to about 100° C.

28. The process of claim 27 wherein the temperature is from about 80° C. to about 100° C.

29. The process of claim 26 wherein the contacting is under a pressure of from about 0.1 to about 2.0 kg/cm².

30. A process for manufacturing a semiconductor wafer, comprising the steps of:

(a) providing a holding block;

(b) providing a semiconductor wafer;

(c) coating one side of the semiconductor wafer with an aqueous adhesive composition, the aqueous adhesive composition comprising water; at least one release agent selected from the group consisting of polyethylene glycols, fluorine-free surfactants selected from anionic, cationic, and nonionic surfactants, fluorine-containing surfactants selected from anionic, cationic and nonionic fluorosurfactants, and silicone polymers; and at least one water-soluble or water-dispersible resin selected from the group consisting of unsubstituted or substituted (meth)acrylic acid containing polymers, unsubstituted or substituted (meth)acrylate containing polymers, unsubstituted or substituted vinyl ester containing polymers, unsubstituted or substituted vinyl aromatic containing polymers, rosin-modified maleic resins, novolak resins, and polymers represented by the formula

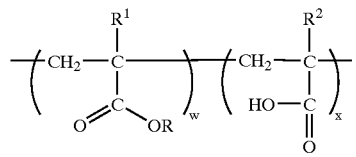

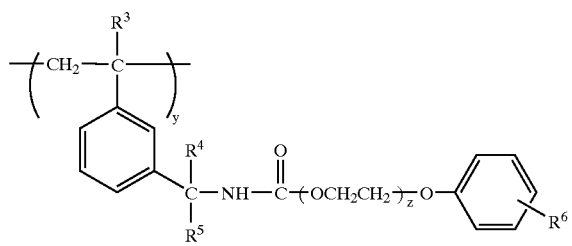

wherein each $R^1$, $R^2$, and $R^3$ independently is hydrogen or methyl; R is a hydrocarbyl group of 1 to 4 carbon atoms; each $R^4$ and $R^5$ independently is hydrogen or a hydrocarbyl group of 1 to 4 carbon atoms; $R^6$ is hydrocarbyl group of 1 to 20 carbon atoms; w, x, y, and z independently are a number from 1 to 100;

(d) contacting the coated side of the semiconductor wafer to the holding block such that the semiconductor wafer adheres to the coated holding block;

(e) polishing the other uncoated side of the semiconductor wafer; and (f) removing the semiconductor wafer from the coated holding block.

31. The process of claim 30 wherein prior to step (d), the coated holding block is heated to a temperature of from about 40° C. to about 120° C.

32. The process of claim 31 wherein the coated holding block is heated to a temperature of from about 70° C. to about 100° C.

33. The process of claim 32 wherein the coated holding block is heated to a temperature of from about 80° C. to about 100° C.

34. The process of claim 30 wherein step (d) takes place at a temperature of from about 40° C. to about 120° C.

35. The process of claim 34 wherein the temperature is from about 70° C. to about 100° C.

36. The process of claim 35 wherein the temperature is from about 80° C. to about 100° C.

37. The process of claim 34 wherein the contacting is under a pressure of from about 0.1 to about 2.0 kg/cm².

* * * * *